US010107872B2

(12) United States Patent
Stephanson (10) Patent No.: US 10,107,872 B2
(45) Date of Patent: Oct. 23, 2018

(54) SELF-CALIBRATING MAGNETIC FIELD MONITOR

(71) Applicant: MIS SECURITY, LLC, Tallahassee, FL (US)

(72) Inventor: Cory J. Stephanson, La Selva Beach, CA (US)

(73) Assignee: MIS SECURITY, LLC, Tallahassee, FL (US)

( * ) Notice: Subject to any disclaimer, the term of this patent is extended or adjusted under 35 U.S.C. 154(b) by 0 days.

(21) Appl. No.: 15/211,682

(22) Filed: Jul. 15, 2016

(65) Prior Publication Data

US 2017/0010335 A1 Jan. 12, 2017

Related U.S. Application Data

(63) Continuation of application No. 14/222,116, filed on Mar. 21, 2014, now Pat. No. 9,404,988, which is a continuation of application No. 13/368,219, filed on Feb. 7, 2012, now Pat. No. 8,729,891, which is a continuation of application No. 12/431,418, filed on Apr. 28, 2009, now Pat. No. 8,120,354.

(60) Provisional application No. 61/049,437, filed on May 1, 2008.

(51) Int. Cl.
| | | |
|---|---|---|
| *G01R 33/00* | (2006.01) | |
| *G01R 33/10* | (2006.01) | |
| *G01V 3/08* | (2006.01) | |
| *G01R 33/02* | (2006.01) | |
| *G01R 35/00* | (2006.01) | |

(52) U.S. Cl.
CPC ......... *G01R 33/0035* (2013.01); *G01R 33/02* (2013.01); *G01R 33/10* (2013.01); *G01R 35/00* (2013.01); *G01V 3/081* (2013.01)

(58) Field of Classification Search
CPC ........ G01N 27/72; G01R 33/00; G01R 33/10; G01R 33/02; G01R 33/0005; G01R 33/0017; G01R 35/00; G01R 35/005; G01R 33/028; G01R 33/0035; G01V 3/081

See application file for complete search history.

(56) References Cited

U.S. PATENT DOCUMENTS

| | | | |
|---|---|---|---|
| 5,054,447 A | 10/1991 | Fukui et al. | |
| 6,816,794 B2* | 11/2004 | Alvi ....................... | G01N 33/02 702/35 |
| 7,631,767 B2 | 12/2009 | May et al. | |
| 8,120,354 B2 | 2/2012 | Stephanson et al. | |
| 8,729,891 B2 | 5/2014 | Stephanson et al. | |
| 2004/0183712 A1* | 9/2004 | Levitan ................... | F41H 13/00 342/22 |
| 2007/0010702 A1 | 1/2007 | Wang et al. | |
| 2007/0013372 A1* | 1/2007 | Murray .................. | G01V 3/081 324/244 |

(Continued)

*Primary Examiner* — Son Le
(74) *Attorney, Agent, or Firm* — Allen, Dyer, Doppelt + Gilchrist, P.A.

(57) ABSTRACT

A self-calibrating magnetic field monitor is disclosed. In one embodiment, a magnetic field sensor repeatedly generates an electronic signal related to the magnetic field. In addition, a calibration module generates a relative baseline signal based on an average value of the electronic signals for a given time period. A comparator compares the electronic signal with the relative baseline signal and generating an output signal if a difference in the comparing is greater than or equal to a threshold.

9 Claims, 8 Drawing Sheets

(56) References Cited

U.S. PATENT DOCUMENTS

2008/0318595 A1* 12/2008 Rofougaran ............ G01S 7/412
  455/456.1
2009/0195401 A1   8/2009 Maroney et al.

* cited by examiner

SELF-CALIBRATING MAGNETIC FIELD MONITOR

CROSS REFERENCE TO RELATED APPLICATIONS

The present patent application is a continuation of U.S. patent application Ser. No. 14/222,116, filed Mar. 21, 2014, entitled "Self-Calibrating Magnetic Field Monitor," by Cory J. Stephanson et al., assigned to the assignee of the present application which is incorporated in its entirety herein; which is a continuation of U.S. patent application Ser. No. 13/368,219, filed Feb. 7, 2012, entitled "Self-Calibrating Magnetic Field Monitor," by Cory J. Stephanson et al., assigned to the assignee of the present application which is incorporated in its entirety herein; which is a continuation of U.S. patent application Ser. No. 12/431,418, filed Apr. 28, 2009, entitled "Self-Calibrating Magnetic Field Monitor," by Cory J. Stephanson et al., assigned to the assignee of the present application which is incorporated in its entirety herein; which claims priority to the co-pending U.S. Provisional Patent Application No.: 61/049,437 entitled "Communications Operational Bridge and Rapid Assessment Sensor Cued Imaging" by Cory J. Stephanson et al., filed May 1, 2008; which is incorporated by reference in its entirety herein.

TECHNICAL FIELD

The field of the present invention relates to a magnetic field monitor.

BACKGROUND

Metal detectors are used in many different applications. For example, present security systems use metal detectors to detect ferrous metal on a person or within closed bags. Other types of magnetic field monitors include large magnetic field sensors that monitor magnetic field strengths from locations such as satellites and the like.

Metal detectors may be a large, heavy, highly calibrated walk through device or a smaller hand-held metal detector or "wand". Usually, the walk through device is utilized to detect metallic objects within a doorway sized area through which a person or object is placed. In contrast, a hand held device is utilized to detect metallic objects by moving around or past an object or person.

Normally, training personnel in the operation of metal detection or magnetic field monitoring systems and the proper methodology of using, calibrating and deploying the metal detection systems is a significant investment in time, training and cost. Moreover, if the systems are miss-calibrated or improperly or incorrectly utilized, detection capabilities can become significantly reduced.

Thus, there is a long felt need for an improved magnetic field monitor system and method having simplified user interactions including set-up, maintenance and operation.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A self-calibrating magnetic field monitor is disclosed. In one embodiment, a magnetic field sensor repeatedly generates an electronic signal related to the magnetic field. In addition, a calibration module generates a relative baseline signal based on an average value of the electronic signals for a given time period. A comparator compares the electronic signal with the relative baseline signal and generating an output signal if a difference in the comparing is greater than or equal to a threshold.

The drawings referred to in this description should be understood as not being drawn to scale except if specifically noted.

DETAILED DESCRIPTION

Reference will now be made in detail to embodiments of the present technology, examples of which are illustrated in the accompanying drawings. While the technology will be described in conjunction with various embodiments, it will be understood that they are not intended to limit the present technology to these embodiments. On the contrary, the presented technology is intended to cover alternatives, modifications and equivalents, which may be included within the spirit and scope the various embodiments as defined by the appended claims.

Furthermore, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the present embodiments.

Overview

A passive, self-correcting and self-calibrating magnetic field monitor having sensitive long range detection characteristics is described. In one embodiment, the magnetic field monitor has a small footprint (e.g., the size of a matchbook) and is reliable and ruggedized. The magnetic field monitor is well suited to stand-alone operation as well as integration with legacy/future technology.

In one embodiment, the magnetic field monitor described herein identifies minute changes in soft-magnetic effect without being deleteriously affected by the ambient earth magnetic field structure or any changes naturally occurring thereto. For example, the self-calibrating magnetic field monitor is capable of detecting a tactical knife at greater than 25 meters and larger weaponry such as pistols and rifles at over 100 meters.

In general, the magnetic field monitor self-calibrates after being introduced into an environment of operation. The post-introduction self-calibration process allows deployment in different environments with minimal testing, support or set-up time. Additionally, the magnetic self monitor repeatedly performs the self-calibration over pre-determined time periods such that natural changes that occur in an environment's magnetic field are filtered or absorbed. For example, fluctuation in the strength of the environment's magnetic field caused by changes in an environments temperature over a period of time.

In addition, the repeated self-calibration characteristics allow the magnetic field monitor to adjust to man-made changes in the environment. For example, if an armed guard approached the magnetic field monitor, the event would be detected and an output signal would be provided. However, by performing a re-calibration, magnetic field monitor is able to re-zero based on the now different environmental magnetic field characteristics. In other words, the armed guards own metal objects would become part of the expected magnetic field instead of an event outside of the normal. This self-calibrating capability also works in the same way with other metallic objects that may already be, or are added to the environment. Objects such as cars, other armed personnel, and the like.

Monitored Environment

Figure 1:
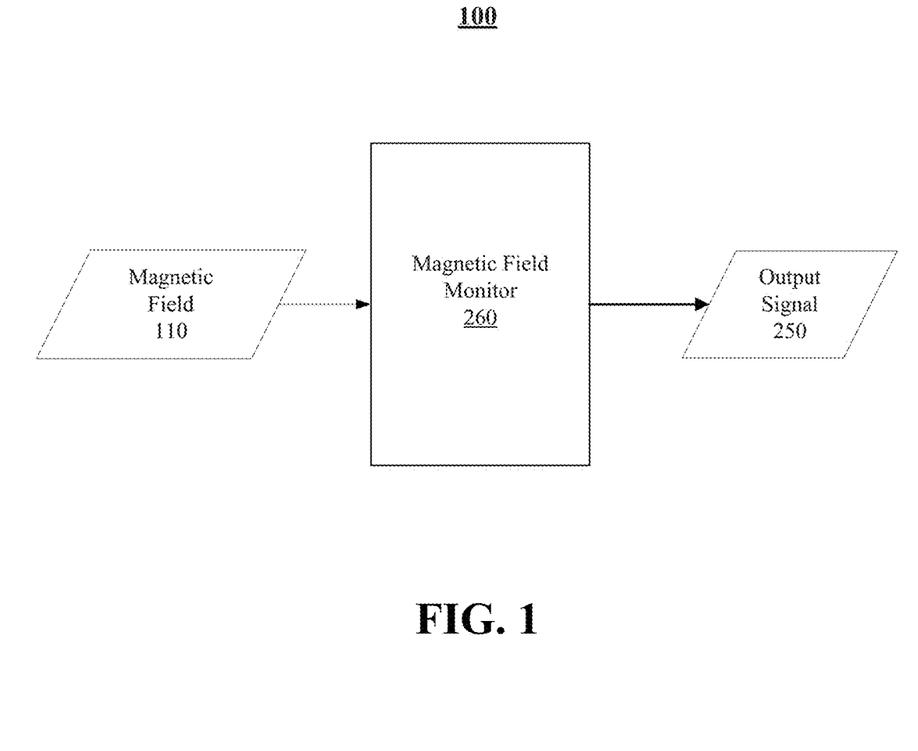
FIG. 1 is a block diagram of one embodiment for monitoring a magnetic field in an environment is shown.

With reference to FIG. 1, a block diagram 100 of one embodiment for monitoring a magnetic field in an environment is shown. In one embodiment, FIG. 1 includes a magnetic field 110 for an environment, a magnetic field monitor 260 and an output signal 250. In one embodiment, system 100 also includes an optional accelerometer 225.

In general, an environment may be natural or built and is usually described utilizing a combination of atmosphere, climate and weather conditions. Example, environments may include, but are not limited to, desert, tundra, canopy, jungle, riverine, aquatic, littoral, savannah, marine, urban or the like.

In one embodiment, the environment and associated magnetic field 110 of the environment is a localized area or portion of an environment, similar to an ecosystem. For example, the area of the environment represented by magnetic field 110 may approximate the range of operation of magnetic field monitor 260.

In one embodiment, the environment and associated magnetic field 110 may be an outdoor area. However, in another embodiment, the environment and associated magnetic field 110 may be an indoor area such as a room, a structure or the like. In yet another embodiment, the environment and associated magnetic field 110 may be a combination of indoor and outdoor areas such as an outpost, or the like. Additionally, part or all of the environment and associated magnetic field 110 may be dry, partially or completely submerged, partially or completely buried, and the like.

Usually, an environment will have certain magnetic field 110 strength for any given period of time. The strength of magnetic field 110 may be represented in the SI units of teslas (T), webers per square meter (Wb/m$^2$) or volt seconds per square meter (V s/m$^2$). Moreover, different environments are known to have different magnetic field 110 strengths. For example, different locations on the Earth's surface can have magnetic field 110 strengths that range from less than 30 microteslas (µT) to more than 60 µT.

However, the strength of a specific environment's magnetic field 110 will also change over time due to changes in temperature, humidity, weather conditions and the like. For example, electric currents induced in the ionosphere near where the atmosphere is closest to the Sun have been known to cause daily alterations in an environments magnetic field 110.

Additionally, there may be other events that change the strength of an environment's magnetic field 110. Events that are not related to natural changes. These events may include an introduction or removal of metal to magnetic field 110. Example events include, but are not limited to, a vehicle, a gun, knife, key, pen, or the like entering into or departing from an environment.

Generally, natural changes in magnetic field 110 occur over a relatively longer period of time than event induced changes. For example, a change in magnetic field 110 due to temperature change will normally occur over a period of a few hours. In contrast, a person walking with a knife through magnetic field 110 may cause the same level of change in magnetic field 110, but the change will occur over a period of seconds.

Magnetic field monitor 260 monitors magnetic field 110 to recognize an event. When magnetic field monitor 260 identifies a change in magnetic field 110 due to an event, output signal 250 is generated. In one embodiment, magnetic field monitor 260 utilizes a relative change methodology instead of explicit field strength values when monitor magnetic field 110.

Magnetic Field Monitor

Figure 2:
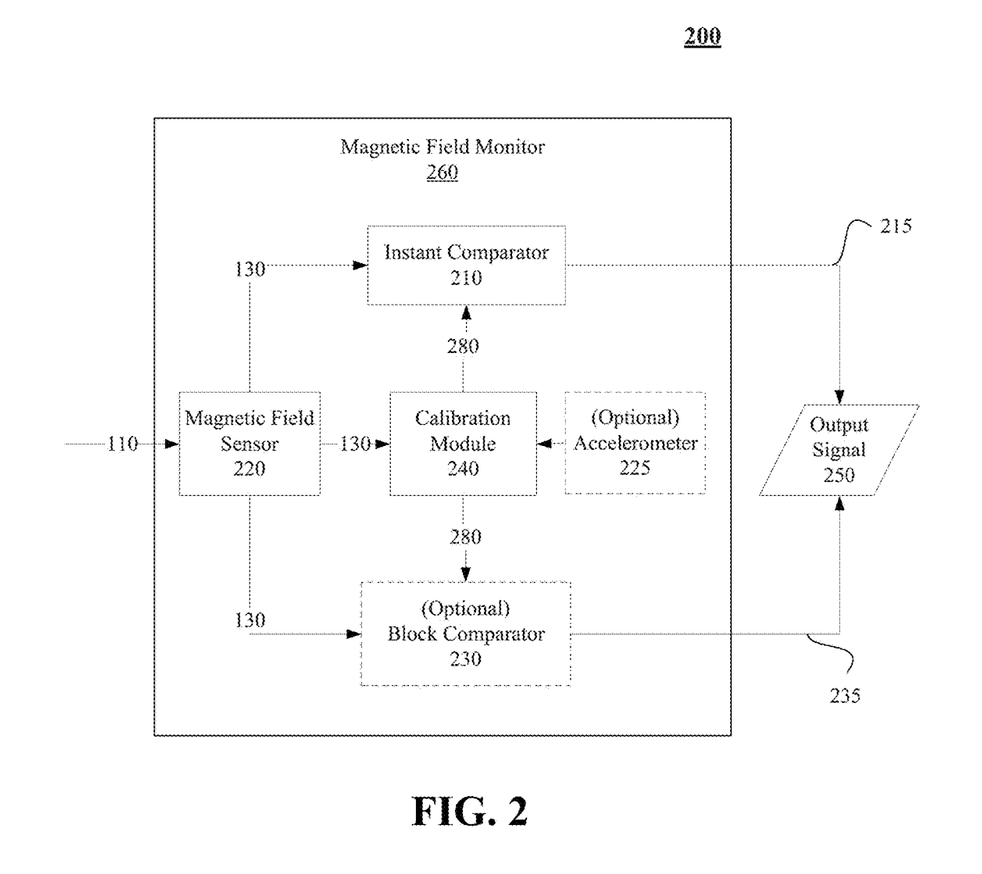
FIG. 2 is a block diagram of a self-calibrating magnetic field monitor shown in accordance with one embodiment of the present technology.

With reference now to FIG. 2, a block diagram 200 of a magnetic field monitoring system is shown in accordance with one embodiment. In one embodiment, magnetic field monitor 260 includes magnetic field sensor 220, calibration module 240, and instant comparator 210. In one embodiment, magnetic field monitor 260 also includes an optional block comparator 230 and accelerometer 225.

Magnetic field sensor 220 may be a flux gate magnetometer sensor, a super conducting quantitative interference detector (SQUID), a magneto resistive sensor, spin electron relaxation frame (SERF) sensor or the like.

In another embodiment, magnetic field sensor 220 may comprise a strip of metal, thin film or the like that is sensitive to magnetic fields. When voltage is applied, magnetic field sensor 220 will provide an analog signal 130 such as a voltage, representative of magnetic field 110. For example, a change in magnetic field 110 will cause a change in the voltage of signal 130. In one embodiment, signal 130 is a relative value for magnetic field 110 and not an explicit magnetic field strength value.

Magnetic field sensor 220 samples magnetic field 110 periodically at a pre-defined rate of time and generates a corresponding signal 130 for each sampling period. For example, magnetic field sensor 220 may use a 1 MHz crystal to establish a nanosecond sample rate. Magnetic field sensor 220 outputs signal 130 to instant comparator 210, calibration module 240 and optional block comparator 230.

Calibration module 240 receives signal 130 from magnetic field sensor 220 and generates a relative baseline signal 280. For example, after calibration module 240 receives an initial time periods worth of signals 130, calibration module 240 will average the signals 130 and generate a relative baseline signal 280. In other words, relative baseline signal 280 is similar to a calibration, recalibration, zero or baseline for the particular magnetic field 110 being monitored. In one embodiment, relative baseline signal 280 is a relative value and not an explicit magnetic field strength value.

In one embodiment, calibration module 240 will generate a new relative baseline signal 280 at a consistent interval. For example, a new relative baseline signal 280 may be generated every few minutes, few seconds, few hours or the like. By adjusting the time of generation for relative baseline signal 280, both sensitivity and range of magnetic field monitor 260 may be adjusted. In one embodiment, calibration module 240 may also include a manual option to allow a user to generate a new relative baseline signal 280.

Calibration module 240 provides relative baseline signal 280 to instant comparator 210 and optional block comparator 230.

Referring still to FIG. 2, in one embodiment, instant comparator 210 performs a comparison between signal 130 and relative baseline signal 280 to recognize a change in magnetic field 110. When the resultant difference between magnetic field 110 and relative baseline signal 280 is greater than or equal to a pre-defined difference threshold, instant comparator 210 provides an output signal 250.

In one embodiment, instant comparator 210 does not utilize an actual magnet field strength value as the threshold value but instead utilizes a threshold value related to the difference between signal 130 and relative baseline signal 280. Thus, in one embodiment, neither signal 130 nor relative baseline signal 280 need include a specific or quantified value for magnetic field 110 as long as magnetic field sensor 220 provides a consistent representation of magnetic field 110 in signal 130. However, in another embodiment, signal 130 and/or relative baseline signal 280 may include a specified value related to magnetic field 110.

For example, the threshold value is based on the absolute value of the difference between signal 130 and relative baseline signal 280. By utilizing the absolute value of the difference, instant comparator 210 is well suited to recognizing changes in magnetic field 110 that increase the field strength as well as changes in magnetic field 110 that reduce the field strength.

Optional block comparator 230 operates in a manner similar to instant comparator 210, but may be calibrated to recognize changes in magnetic field 110 over a greater time period than instant comparator 210. When the change over time for relative baseline signal 280 is greater than or equal to a pre-defined threshold, block comparator 230 provides an output signal 250.

In another embodiment, block comparator 230 may monitor a plurality of relative baseline signals 280 over time to detect changes in magnetic field 110 over time. In yet another embodiment, block comparator 230 does not utilize a difference between the pluralities of relative baseline signals 280 as the threshold. Instead, block comparator 230 utilizes a threshold value related to the area under the curve defined by the plurality of relative baseline signals 280. However, the functions described herein as being performed by optional block comparator 230 may be performed by either or both of instant comparator 210 and calibration module 240. However, for purposes of clarity, optional block comparator 230 is described herein as separate from instant comparator 210 and calibration module 240.

Optional accelerometer 225 is utilized to provide motion and orientation information to magnetic field monitor 260. For example, if magnetic field monitor were hanging from a tree, rolled across the ground, bumped, rotated, moved or the like, accelerometer 225 would provide orientation and motion information that would allow magnetic field monitor 260 to maintain its calibration.

For example, if magnetic field monitor 260 is rotating accelerometer 225 will provide calibration module 240 with real time information about the orientation of magnetic field sensor 220. This information allows calibration module 240 to generate and maintain a plurality of distinct baseline signals 280 directly related to the orientation of magnetic field sensor 220 at the time signal 130 was generated (or received). Thus, calibration module 240 is able to provide both instant comparator 210 and block comparator 230 with the appropriate relative baseline signal 280 for each signal 130 received from magnetic field sensor 220. Thus, in one embodiment, any changes in orientation of magnetic field monitor 260 would be resolved at calibration module 240 prior to the operations of either instant comparator 210 or block comparator 230.

In one embodiment, accelerometer 225 is a component found outside of magnetic field monitor 260. However, in another embodiment, such as shown in FIG. 2, accelerometer 225 may be located within magnetic field monitor 260.

Operation

Figure 3:
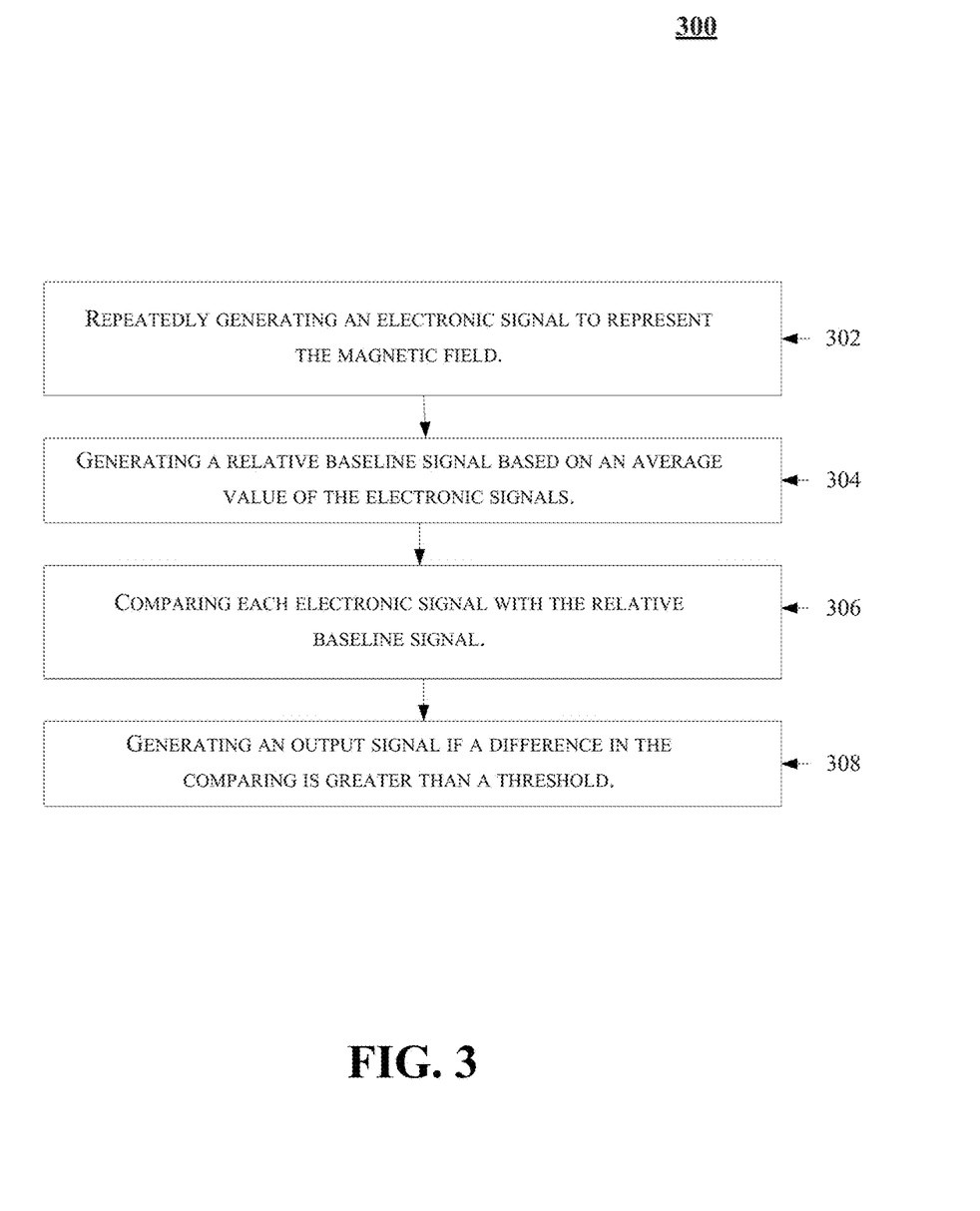
FIG. 3 is a flowchart of an exemplary method for monitoring a magnetic field in an environment for magnetic field fluctuations in accordance with one embodiment of the present technology.

With reference now to FIG. 3, a flowchart 300 of one method for monitoring a magnetic field in an environment is shown in accordance with one embodiment. In the following description, graphs 410-440 of FIG. 4 and graphs 510-540 of FIG. 5 are utilized to illustrate two of the plurality of possible embodiments for representing a method for monitoring a magnetic field in an environment in accordance with one embodiment of the present technology.

Figure 4:
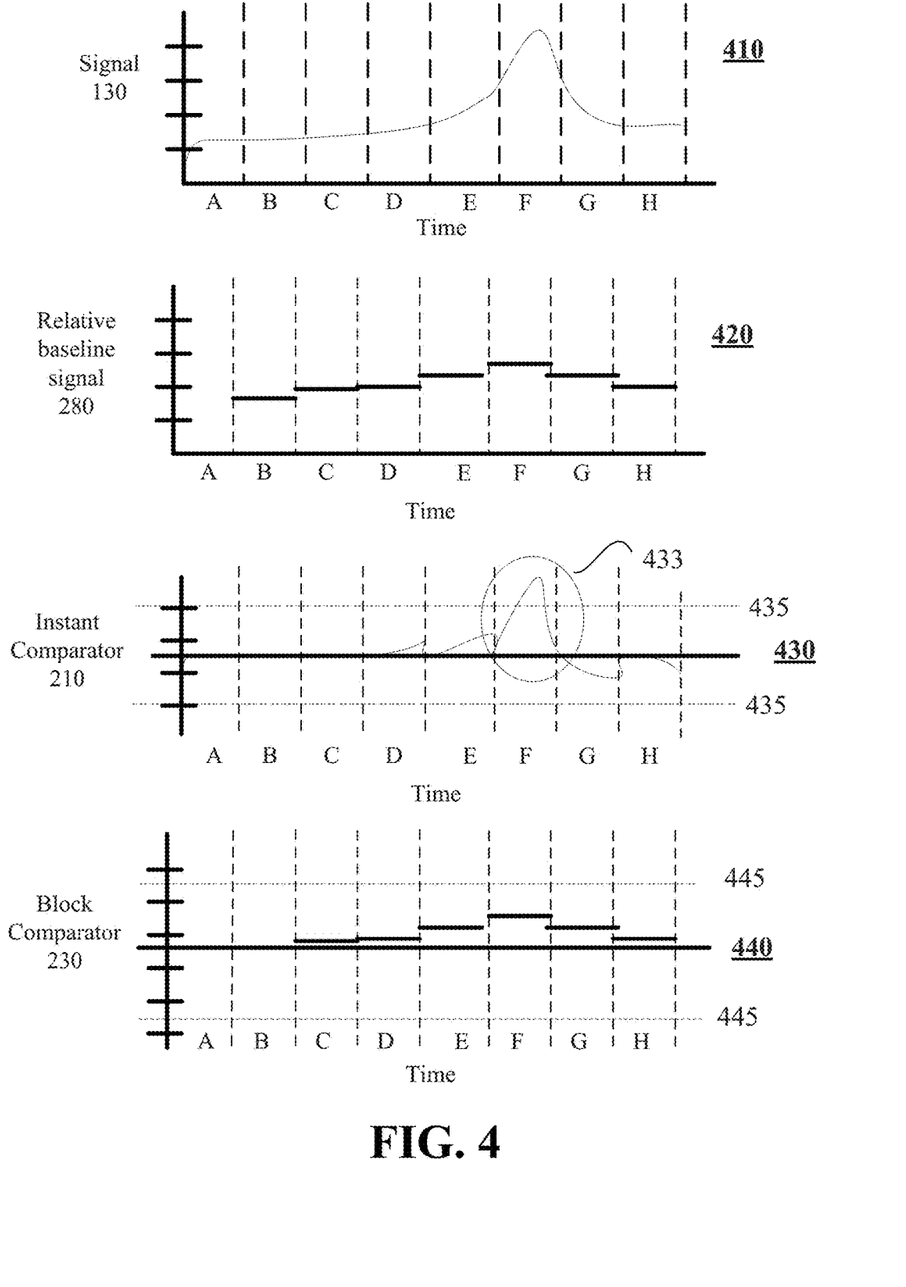
FIG. 4 is a plurality of graphs illustrating one embodiment for monitoring a magnetic field in an environment in accordance with one embodiment of the present technology.
Figure 5:
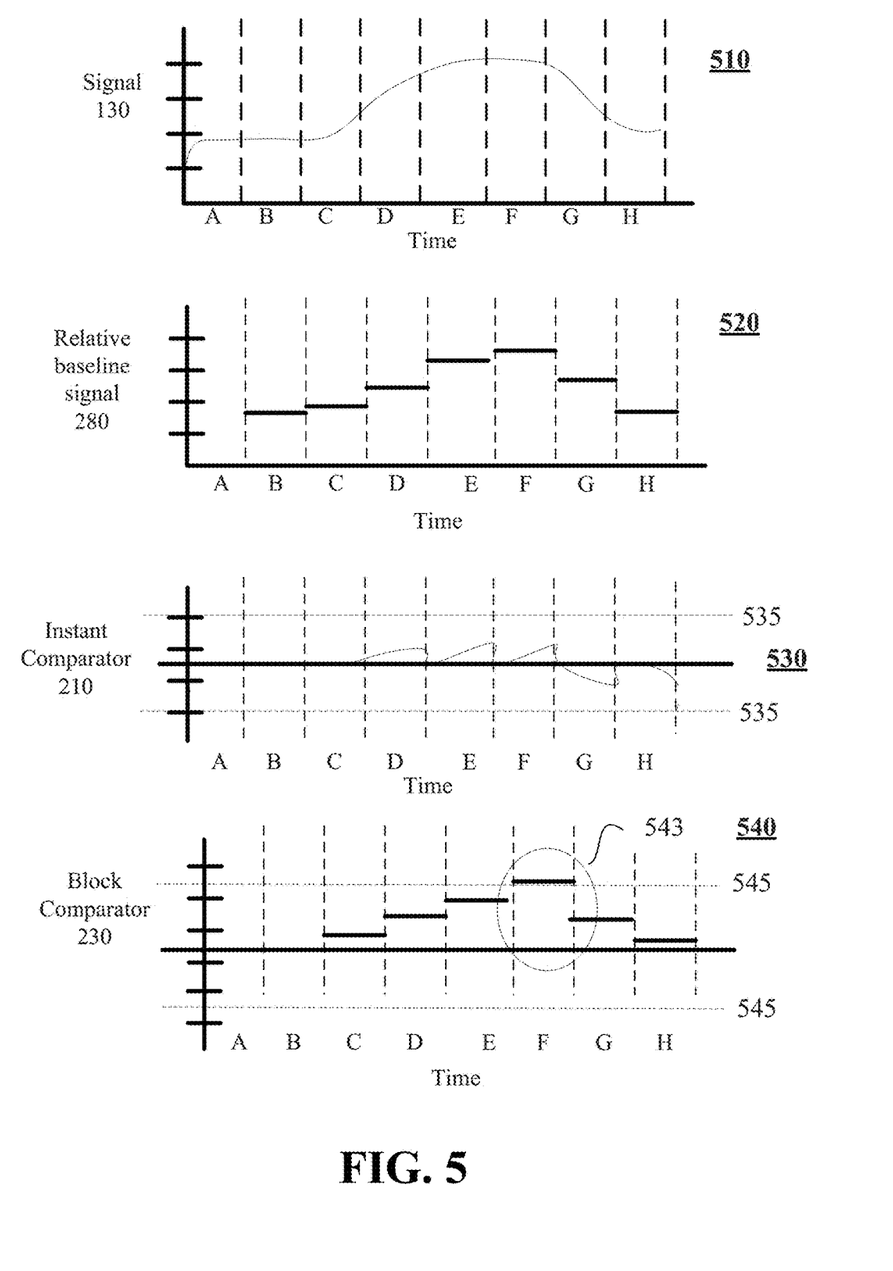
FIG. 5 is a plurality of graphs illustrating another embodiment for monitoring a magnetic field in an environment in accordance with one embodiment of the present technology.

At 302 of FIG. 3 as well as graph 410 of FIG. 4 and 510 of FIG. 5, one embodiment repeatedly generates a signal 130 representing magnetic field 110. In one embodiment, a clock is utilized to determine when signal 130 is generated. For example, a 1 MHz clock may be used such that a new signal 130 is generated each nanosecond. In one embodiment, signal 130 may be an analog signal. In one embodiment, the line plotted on graphs 410 and 510 illustrates a plurality of signals 130 for a time period A-H.

With reference now to 304 of FIG. 3 as well as graph 420 of FIG. 4 and 520 of FIG. 5, one embodiment generates a relative baseline signal 280 based on an average value of the signal 130. In other words, calibration module 240 receives a number of electronic signals 130 from magnetic field sensor 220 over a given period of time and averages the signals 130 for that time period to generate a relative baseline signal 280. In one embodiment, calibration module 240 provides the relative baseline signal 280 to instant comparator 210 and block comparator 230.

For example, calibration module 240 may average signals 130 over a 5 second time period when generating relative baseline signal 280. In another embodiment, calibration module 240 may average received signals 130 over a 5 minute, 20 minute, 1 hour, 2 hour, 6 hour, 12 hour, 24 hour, etc. time period before generating relative baseline signal 280. In one embodiment, the length of time represented by relative baseline signal 280 may be directly related to the sensitivity and/or range of magnetic field monitor 260.

With respect to FIGS. 4 and 5, time segments A-H represent the time period for which relative baseline signal 280 is an average. For example, if calibration module 240 average signals 130 over a 20 second time period when generating relative baseline signal 280, then time segment A, and similarly time segments B-H would represent 20 seconds. As shown in graph 420, in one embodiment, relative baseline signal 280 is an average of the previous time periods worth of signals 130. For example, at graphs 420 and 520 time period A is an initial calibration period and therefore has no relative baseline signal 280.

With reference now to 306 of FIG. 3 as well as graph 430 of FIG. 4 and 530 of FIG. 5, one embodiment compares each signal 130 with relative baseline signal 280. For example, as shown in graph 430 and 530, in one embodiment, instant comparator 210 looks at the difference between signal 130 and relative baseline signal 280. In one embodiment, the sensitivity of instant comparator 210 is not affected by the direction of a change in strength of magnetic field 110. For example, an event such as a metal object leaving the magnetic field 110 would provide a change in the strength of magnetic field 110 that would be as recognizable as an event such as a metal object entering magnetic field 110.

By utilizing a difference comparison between the consistently updated relative baseline signal 280 and signal 130, most changes that occur naturally in magnetic field 110 can be dealt with prior to detrimentally affecting the sensitivity of instant comparator 210. For example, if magnetic field 110 varies naturally over time, such as can occur during changes in the daily temperature, Sun activity, atmospheric conditions and the like, adjusting relative baseline signal 280 to remove the natural magnetic field 110 variation will allow instant comparator 210 to remain at a consistent and very high level of sensitivity. In one embodiment, the operational sensitivity of instant comparator 210 may be less than or equal to the natural variations in the environment's magnetic field 110. Therefore, by normalizing or adjusting the relative baseline signal 280, magnetic field monitor 260 is capable of detecting femto-Tesla signatures, e.g., signatures that are far below the Earth's field.

For example, as shown in graphs 410 magnetic field 110 is naturally growing stronger. However, the normal baseline as shown in graph 430 adjusts to zero out the natural change while the event detection threshold 435, in either direction, remains a constant distance from the baseline. Similarly, if the magnetic field was reduced in strength, the baseline would be adjusted to zero out the natural change while the event detection threshold 435 would remain a constant distance from the normal baseline.

As shown in graph 430, in one threshold breaching event 433, such as a knife being introduced into the environment, the increase in the strength of magnetic field 110 causes a similar change in signal 130 above threshold 435. Thus, at time F, an event 433 is recognized by instant comparator 210. Similarly, in another threshold breaching event, such as a gun being removed from the environment, the reduction in the strength of magnetic field 110 causes a similar change in signal 130 recognized as an event by instant comparator 210. As previously stated herein, in one embodiment, due to the normalization characteristics the recognized change in the magnetic field 110 may be at the femto-Tesla level.

However, in one embodiment as shown in graphs 510 through 540 of FIG. 5, when relative baseline signal 280 is updated often, a slower event, such as a person with a knife crawling or moving slowly through the environment may also become averaged out and thus not be recognized by instant comparator 210.

One method for dealing with slower event detection would be to update relative baseline signal 280 less often. In so doing, slower events such as a person with a handgun crawling or moving slowly through an environment would be recognized at instant comparator 210. However, the slower updates would similarly cause a reduction in the sensitivity of instant comparator 210.

In one embodiment, the utilization of optional block comparator 230 as well as instant comparator 210 allows magnetic field monitor 260 to maintain numerous levels of sensitivity to changes in magnetic field 110 at the same time. For example, as shown in graphs 510-540, a slow moving event occurred. At graph 530, the event has been averaged out due to the faster update of relative baseline signal 280.

However, as shown in graph 540, by monitoring changes to relative baseline signal 280, e.g., monitoring magnetic field 110 changes over a longer period of time, block comparator 230 is able to recognize event 543. Thus, by utilizing both instant comparator 210 and block comparator 230, magnetic field monitor 260 can have both a high level of sensitivity as well as a large field of range.

In another embodiment, block comparator 230 may similarly compare signal 130 with relative baseline signal 280 as instant comparator 210 with the difference being block comparator 230 may use the same relative baseline signal 280 for two or more time periods. In other words, instead of using the new relative baseline signal 280 each time it is provided, block comparator 230 may only utilize every other, third, etc., relative baseline signal 280.

In another embodiment, block comparator 230 may only look at relative baseline signals 280 and utilize a threshold based on a total change in the size of relative baseline signals 280 over a pre-determined time period. For example, a relative baseline signal 280 for time period B may be compared with each relative base signal for the next 7 time periods. An event would be detected if the difference passes a pre-defined threshold difference value. In one embodiment, block comparator 230 may perform the comparison for each relative base signal 280. Although 7 time periods are mentioned, any number of alternate time periods or time period portions may be used herein. Further, the number of time periods may be adjustable depending on sensitivity or range characteristics.

In yet another embodiment, block comparator 230 may only look at relative baseline signals 280 and utilize an area under the curve type threshold over a pre-determined time period. For example, as shown in graph 540, block comparator 230 may calculate the area under the curve for a given time period of relative baseline signals 280. Although 6 time periods are shown, any number of alternate time periods or time period portions may be used herein. Further, the number of time periods may be adjustable depending on sensitivity or range characteristics.

Referring now to 308 of FIG. 3, one embodiment generates an output signal 250 when a difference in the comparing is greater than a threshold. For example, if a person carried a knife into the magnetic field 110 being monitored, the correlating change in the strength of magnetic field 110 would be recognized by magnetic field monitor 260. As a result magnetic field monitor 260 would provide an output signal 250 such as an audible mechanical and/or visual alarm configured to be heard by a human being. In an alternative embodiment, output signal 250 may be sent via a communication network to automatically notify designated personnel when an event is detected.

In another embodiment, output signal 250 may be received by another device that will carry out a follow-on task. For example, output signal 250 could provide a turn-on signal for one or more lights, such a light located in the vicinity of the detected event. Additionally, output signal 250 could include a signal to generate a notification of the detected event to a remote location. In one embodiment, output signal 250 may initiate an automatic action to incapacitate an identified threat. For example, as in a building having doors and windows that may be electronically locked output signal 250 may automatically lock one or more of the building's doors and windows.

Moreover, by utilizing the optional accelerometer 225, if magnetic field monitor is moving, output signal 250 may include direction about the event. In one embodiment, direction may include distance, bearing, velocity, relative velocity, and the like. Similarly, if magnetic field monitor were remote, output signal 250 may include a message having one or more attributes associated with the event, such as the location of the event, when the event was detected, contact information for certain persons of interest or directions for the recipient of the message.

Figure 6:
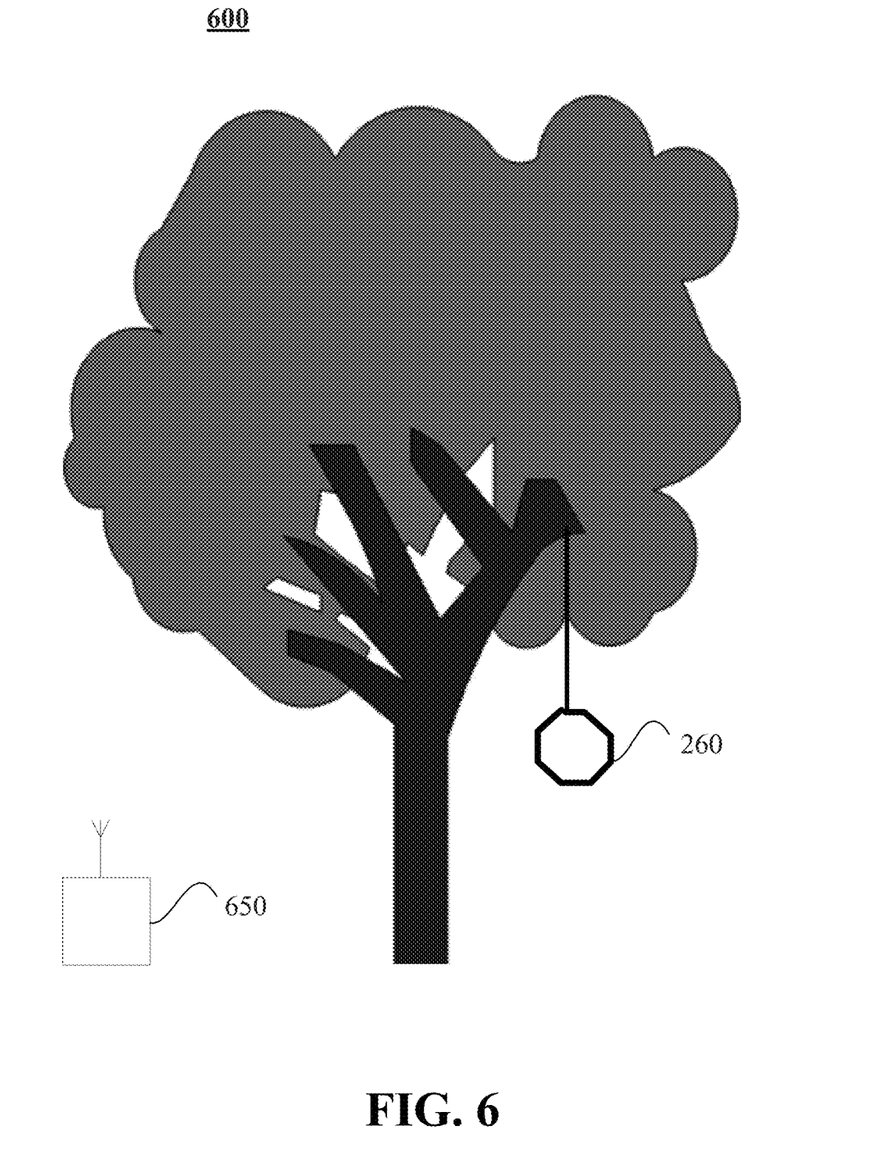
FIG. 6 is a diagram of an environment having a magnetic field monitor therein in accordance with one embodiment of the present technology.

Output signal 250 may also incorporate an imaging and/or audio trigger. For example, in response to a received output signal 250, an imaging device, such as imaging device 825 of FIG. 8 will begin to capture images and/or video of the monitored environment 600, or corridor 800. Similarly, in response to a received output signal 250, an audio device may begin to capture audio of the monitored environment 600. In one embodiment, output signal 250 could incorporate any or all of the above.

With reference now to FIG. 6, an environment 600 in which magnetic field monitor 260 and a remote communications device 650 is shown in accordance with one embodiment. Although in FIG. 6 magnetic field monitor 260 is shown as suspended from a tree it is merely one of a plurality of possible deployment options. Magnetic field monitor 260 is well suited to placement on the ground, in a building, on an object such as a table, partially or completely submerged, partially or completely buried, and the like. Additionally, FIG. 6 illustrates one embodiment wherein accelerometer 225 would be useful.

In one embodiment, magnetic field monitor 260 wired or wirelessly transmits output signal 250 to a remote communications device 650 by implementing a communication technology selected from a group of communication technologies consisting of AM, FM, PCM, GPS, RS232, RS485, USB, firewire, infrared and fiber optic communication technologies.

For example, in one embodiment magnetic field monitor 260 wirelessly transmits the generated output signal to communications device 650. For instance, if an analog output signal 250 is generated, the signal could be transmitted using AM or FM communication technologies in which the output signal is modulated with a carrier signal, and then electromagnetically communicated to communications device 650. In one embodiment, communications device 650 is utilized to receive the modulated output signal from magnetic field monitor 260, and then initiate an action and/or route output signal 250 to another device either wired or wirelessly. In so doing, the communication range of magnetic field monitor 260 and more specifically output signal 250 can be significantly increased with little or no increase in size or power requirements of magnetic field monitor 260.

Magnetic field monitor 260 is capable of operation in both an attended state and an unattended state. For example, magnetic field monitor 260 is well suited to be placed in an environment that is constantly supervised, such as a checkpoint, chokepoint, or the like. In another embodiment, magnetic field monitor 260 is able to be "dropped" into an area to act as a standalone environment monitor. For example, magnetic field monitor 260 may be placed in a location such as a closed hallway, off-limits area, front yard, driveway, room exit, building exit, parking garage, perimeter, and the like. In one embodiment, during operation in an unmanned operating environment, output signal 250 from magnetic field monitor 260 may be communicated to a remote site, may initiate an alarm, initiate a lock-down sequence, provide an activation signal to another device, and the like.

As stated herein, magnetic field monitor 260 may be employed in desert, jungle, riverine, littoral and/or coastal regions. Furthermore, due to the self-calibrating characteristics, magnetic field monitor 260 is also capable of operating under a wide range of physical conditions such as, high humidity, low humidity, extreme temperature ranges, dusty, dirty, sandy and muddy conditions, partially or completely submerged, partially or completely buried, and the like. For example, magnetic field monitor 260 is capable of operating in environments with one or more significant physical conditions such as, but not limited to, tropical or arctic environments.

Additionally, magnetic field monitor 260 is capable of operation in environments having changing physical conditions. That is, the repetitive self-calibrating capabilities of magnetic field monitor 260 allow magnetic field monitor 260 to remain viable in a constantly changing environment such as a desert environment that may have daily or weekly environmental changes (e.g., temperatures that range from at or below freezing at night to 40 degrees Celsius midday). In another embodiment, magnetic field monitor 260 is also well suited for operation in a controlled environment having little or no harsh physical conditions, such as an airport terminal, building, parking lot and the like.

In another embodiment, magnetic field monitor 260 is also very useful in an environment where a walk-through or hand-held metal detector is utilized. Although, as stated herein, magnetic field monitor 260 is well suited as a replacement for either or both of the walk-through and hand-held metal detector, due to the distinctly different approach of monitoring an environments magnetic field, magnetic field monitor 260 is also well suited for use in conjunction with a walk-though and/or hand-held metal detector. For example, in many security environments people are formed up in queue to pass through the checkpoint. In addition, some checkpoints such as metal-detection checkpoints provide a chokepoint with many unscreened people waiting to pass through the metal-detector. The present security checkpoints do not provide security for people waiting to pass through. Moreover, in higher stress environments security personnel are on lookout for people that appear stressed or people dressed in loose clothing that are approaching the checkpoint. In some environments, a human evaluation may be utilized by security personnel prior to a suspicious person even entering the screening queue. For example, a security guard may have to ask someone to open up the baggy shirt or answer a few questions.

However, magnetic field monitor 260 may be deployed in this same scenario as a means of pre-scanning anyone or anything approaching the checkpoint. For example, in one embodiment, magnetic field monitor 260 may be set to trigger if an event is detected within a pre-defined area around the checkpoint. Such a pre-warning would allow anyone at the checkpoint to react to the event with an amount of stand-off distance. Further, in one embodiment, when used in combination with a walk-through metal detector, magnetic field monitor 260 may be calibrated to increase range while sacrificing some sensitivity since the walk-through metal detector may be providing the finer level of sensitivity.

Although a walk-through or hand-held metal detector is utilized in the example, it is merely as an example of one way magnetic field monitor 260 may be incorporated into a previously established screening scenario. In one embodiment, magnetic field monitor 260 may act as both the long range and fine level detector in a similar checkpoint without requiring any other type of metal detection system.

In one embodiment, two or more magnetic field sensors 220 may be utilized within a single magnetic field monitor 260. By utilizing two or more magnetic field sensors 220, magnetic field monitor 260 would be able to determine additional information relating to an event, information such as speed, direction, velocity, etc. Moreover, one or more of the magnetic field sensors 220 may be set for different range and or sensitivity detection characteristics. In so doing, a single magnetic field monitor 260 would be able to provide both long distance monitoring and shorter range, but more sensitive, magnetic field monitoring.

In another embodiment, two or more magnetic field monitors 260 may be utilized in a networked configuration. The networked configuration may include magnetic field monitors 260 monitoring overlapping magnetic fields, monitoring adjacent magnetic fields, offset magnetic fields, or a combination thereof. Further, one or more of the magnetic field monitors 260 may be set for longer range detection, e.g., providing longer distance monitoring while one or more may be set for shorter range but more sensitive magnetic field monitoring.

For example, a first magnetic field monitor 260 may be placed in a first location and a second magnetic field monitor 260 may be placed in a second location. In one embodiment, the first and the second magnetic field monitors 260 may be monitoring overlapping magnetic fields 110. By comparing the electronic signals 130 from the first and second magnetic field monitors, such as at calibration module 240, common mode errors can be detected. For example, if a similar event occurs instantly in both magnetic fields 110 being monitored, the comparison would detect the similar event and recognize that the event as a common error and, in one embodiment, not generate an output signal 250 for the event.

Figure 8:
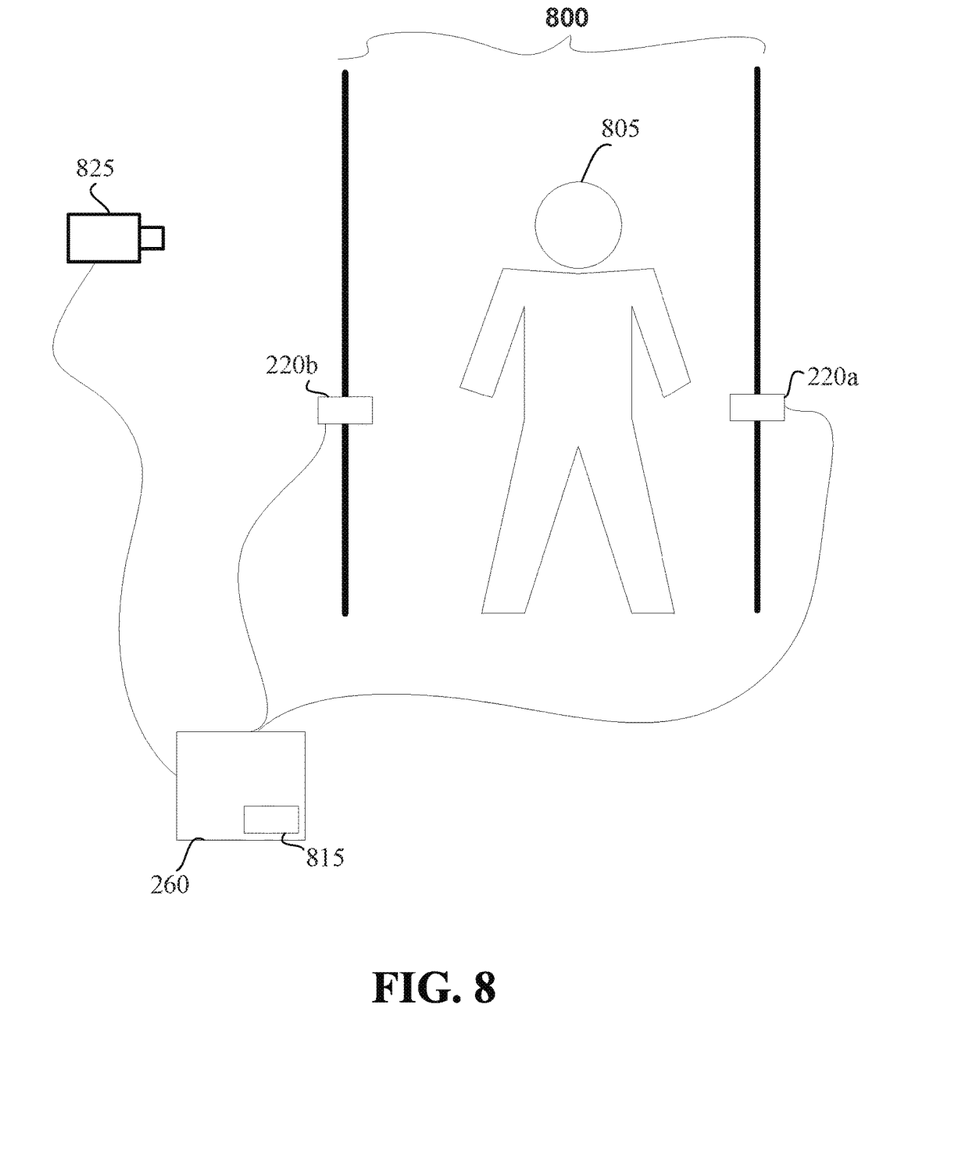
FIG. 8 is a diagram of a corridor having a magnetic field monitor with a plurality of magnetic field sensors therein in accordance with one embodiment of the present technology.

In addition, by comparing the electronic signals from two or more magnetic field sensors 220, increase in sensitivity and range for the monitoring of the magnetic field can be achieved. Moreover, as shown in FIG. 8, comparing the electronic signals from two or more magnetic field sensors, such as magnetic field sensor 220a and magnetic field sensor 220b, allows output signal 250 to include orientation information such as distance, speed, bearing, etc. of an event. For example, a person 805 carrying a rifle through magnetic field 110 would cause a change recognizable by two or more magnetic field sensors 220a and 220b in one or more magnetic field monitors 260. By comparing the strengths of signal 130 or output signals 250 for each of magnetic field sensors 220a and 220b, a location, direction, speed of travel, or the like for the person carrying the rifle may be provided. Moreover, by networking a plurality of magnetic field monitors 260, a much larger area may be monitored. For example, the magnetic field monitors 260 may be laid out in a web type pattern, over a large distance with overlapping fields, over a large distance without overlapping fields, in a corridor monitoring fashion such as corridor 800, and the like.

In one embodiment, magnetic field monitor 260 is powered by means of an electrical power source. This electrical power source may comprise an internal power source, such as a system battery 815 as shown in FIG. 8, or an external power source, such as a transmission line that delivers alternating current and that may be accessed through an electrical wall socket. Further, the sensor described herein may be small and portable, e.g., reduced power requirements possibly having a shorter range; larger vehicle deployed, e.g., increased power requirements, thereby increasing the range; or may be hard mounted, such as on or in a building or other structure. In one embodiment, magnetic field monitor 260 may be selectively powered up and selectively powered-down to extend battery life.

Magnetic field monitor 260 may also be expanded to include data storage for various purposes. For instance, in an embodiment, signal 130, relative baseline signal 280 and/or information generated by instant comparator 210 and block comparator 230 is stored in a storage unit such that the data may be subsequently retrieved and further processed. For example, a hard disk drive (HDD) or random access memory (RAM) is used to electronically store the data by means of arrays of electronic capacitors that are configured to acquire an electronic charge, wherein the charging of the capacitor arrays corresponds to a digital representation of the acquired data. However, it is understood that the aforementioned examples are merely exemplary of different storage units that may be implemented pursuant to various embodiments of the present technology. Other suitable storage units may also be utilized to store data such that it may be later accessed and processed. For instance, a portable flash drive may be used to store data, and the flash drive could be physically transported from a first computing system to a second computing system, wherein both computing systems are capable of accessing data stored on the drive.

Example Computing System

Figure 7:
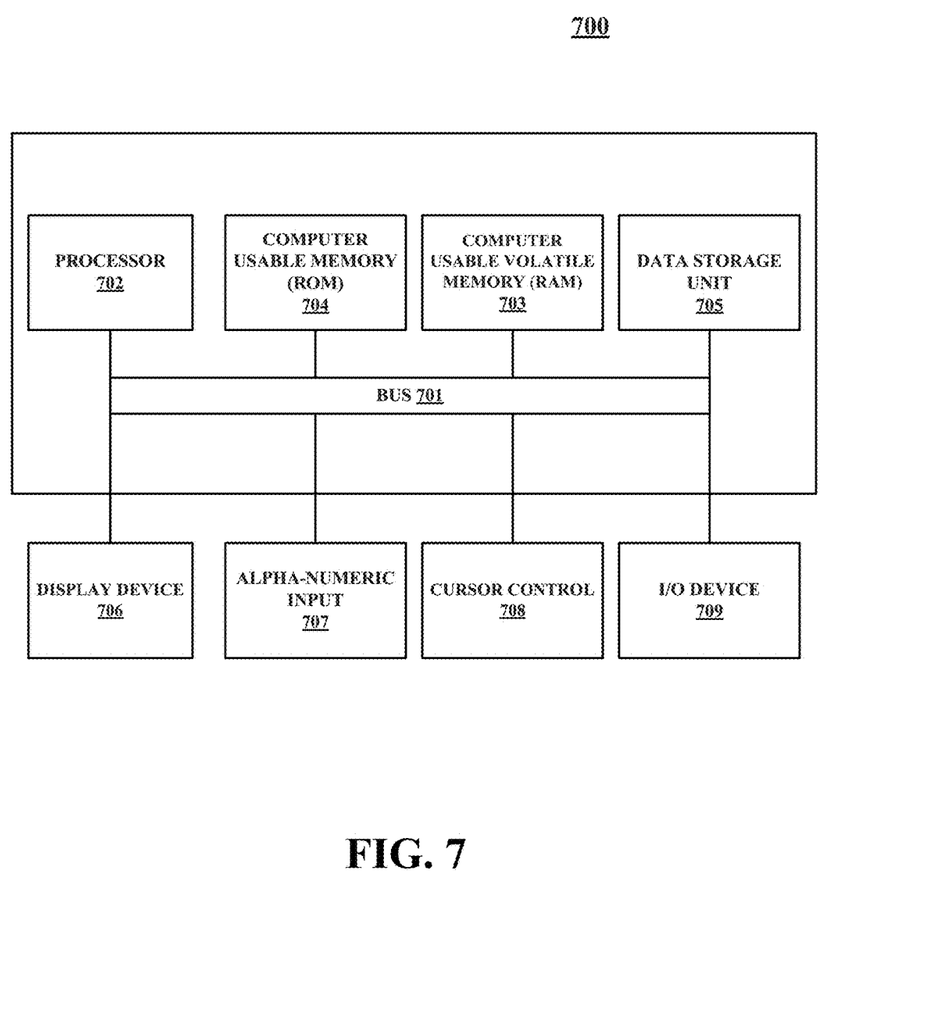
FIG. 7 is a block diagram of an exemplary computer system in accordance with one embodiment of the present technology.

Referring now to FIG. 7, a diagram of computer system 700 in accordance with one embodiment of the present invention is shown in greater detail. Within the discussions certain processes are discussed that are realized, in one embodiment, as a series of instructions that reside within computer readable memory units of system 700 and executed by processor 702 of system 700. When executed, the instructions cause the computer system 700 to perform specific functions and exhibit specific behavior as described.

In general, computer system 700 used by the embodiments of the present invention comprises an address/data bus 701 for communicating information, one or more central processors 702 coupled with the bus 701 for processing information and instructions, a computer readable volatile memory unit 703 (e.g., random access memory, static RAM, dynamic, RAM, etc.) coupled with the bus 701 for storing information and instructions for the central processor(s) 702, a computer readable non-volatile memory unit 704 (e.g., read only memory, programmable ROM, flash memory, EPROM, EEPROM, etc.) coupled with the bus 701 for storing static information and instructions for the processor(s) 702.

System 700 also includes a mass storage computer readable data storage device 705 such as a magnetic or optical disk and disk drive coupled with the bus 701 for storing information and instructions. Optionally, system 700 can include a display device 706 coupled to the bus 701 for displaying information to the computer user (e.g., maintenance technician, etc.), an alphanumeric input device 707 including alphanumeric and function keys coupled to the bus 701 for communicating information and command selections to the central processor(s) 702, a cursor control device 708 coupled to the bus for communicating user input information and command selections to the central processor(s)

702, and a signal generating input/output device 709 coupled to the bus 701 for communicating command selections to the processor(s) 702.

Examples of well known computing systems, environments, and configurations that may be suitable for use with the present technology include, but are not limited to, personal computers, server computers, hand-held or laptop devices, multiprocessor systems, microprocessor-based systems, set-top boxes, programmable consumer electronics, network PCs, minicomputers, mainframe computers, distributed computing environments that include any of the above systems or devices, and the like.

It should be further understood that the examples and embodiments pertaining to the systems and methods disclosed herein are not meant to limit the possible implementations of the present technology. Further, although the subject matter has been described in a language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A self-calibrating magnetic field monitoring system for sensing an event within a monitored environment comprising:
    a plurality of magnetic field sensors each configured to repeatedly generate an electronic signal related to said magnetic field of an event within the monitored environment;
    a calibrator connected to each of said magnetic field sensors, said calibrator comprising a processor and a memory and configured to generate a relative baseline signal based on an average value of the electronic signals from each of the magnetic field sensors for a given time period and automatically generate said relative baseline signal over each said time period to dynamically adjust for an environmentally caused change in said magnetic field;
    a comparator connected to said calibrator and configured to compare said electronic signals from each of the magnetic field sensors with said relative baseline signal and to perform a delayed comparison between said electronic signal and a previously generated relative baseline signal and generate an output signal if a difference in the comparison is greater than or equal to a threshold value, said output signal including orientation information of distance, speed and bearing of an event, wherein the threshold value is based on an absolute value of a difference between said output signal and said relative baseline signal, and wherein the comparator dynamically recognizes changes in magnetic field that increase the field strength and changes in the magnetic field that reduce the field strength;
    an accelerometer associated with each magnetic field sensor to provide motion and orientation information with respect to said magnetic field sensor; and
    an imaging device contained within the monitored environment and connected to said comparator and responsive to said output signal to initiate operation and capture images of said monitored environment.

2. The self-calibrating magnetic field monitoring system of claim 1, wherein said calibrator generates a new relative baseline signal for each given time period.

3. The self-calibrating magnetic field monitoring system of claim 2 further comprising:
    a block comparator for comparing a plurality of said relative baseline signal and generating an output signal if a difference in the comparing is greater than or equal to a threshold value.

4. The self-calibrating magnetic field monitoring system of claim 2 wherein said calibrator generates said new relative baseline signal for each given time period to normalize an environmentally caused change in said magnetic field.

5. The self-calibrating magnetic field monitoring system of claim 1, wherein said self-calibrating magnetic field monitor is a passive monitor.

6. The self-calibrating magnetic field monitoring system of claim 1 wherein said output signal is transmitted to a remote receiver.

7. The self-calibrating magnetic field monitoring system of claim 6, wherein said output signal is wirelessly transmitted to said remote receiver by a communication technology selected from a group consisting of AM, FM, PCM, GPS, RS232, RS485, USB, firewire, infrared and fiber optic communication technologies.

8. The self-calibrating magnetic field monitoring system of claim 1 wherein said output signal causes an automatic execution a predefined action.

9. The self-calibrating magnetic field monitoring system of claim 1 wherein a plurality of magnetic field sensor electronic signals are utilized to determine orientation information selected from the group consisting of: direction, distance and speed.

* * * * *